BALANCED PARAPHASE AMPLIFIER INCLUDING A FEED FORWARD PATH

Filed Aug. 19, 1963

JOHN R. KOBBE
INVENTOR.
BY
BUCKHORN, BLORE, KLARQUIST & SPARKMAN
ATTORNEYS

United States Patent Office 3,247,462
Patented Apr. 19, 1966

3,247,462

BALANCED PARAPHASE AMPLIFIER INCLUDING A FEED FORWARD PATH

John R. Kobbe, Beaverton, Oreg., assignor to Tektronix, Inc., Beaverton, Oreg., a corporation of Oregon Filed Aug. 19, 1963, Ser. No. 302,980
5 Claims. (Cl. 330—14)

Figure 1:
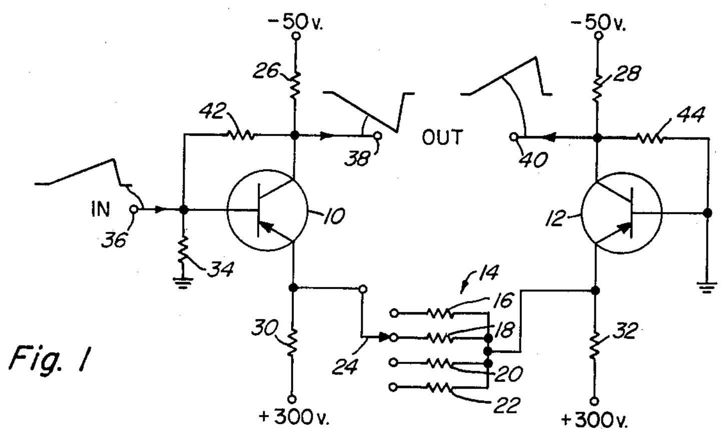

The subject matter of the present invention relates generally to electrical signal amplifier circuits having push-pull output signals, and in particular to a paraphase amplifier which converts a single-ended input signal to push-pull output signals. The paraphase amplifier of the present invention is connected so that its output signals are balanced to have substantially the same amplitude over a wider range of gain variations.

The paraphase amplifier of the present invention is especially useful when employed in the horizontal amplifier of a cathode ray oscilloscope to convert a ramp or saw tooth shaped time base signal to a push-pull ramp signal before applying it to the horizontal deflection plates of such oscilloscope. In order that the wave form of a vertical signal applied to the vertical deflection plates of an oscilloscope may be properly displayed on the fluorescent screen of such oscilloscope it is often necessary to vary the gain of the paraphase horizontal amplifier in order to change the amplitude of the time base signal. Previous paraphase amplifiers have been limited to a range of gain variation of approximately 3 to 1 since any increase beyond this range resulted in an imbalance in the output signals of such amplifier. This imbalance or difference in the voltage of the push-pull output signals causes a distortion in the vertical signal wave form displayed on the oscilloscope screen.

The present paraphase amplifier remains balanced over a much larger range of amplification by employing a shunt resistor connected from the input to the output of the signal translating device employed in the input stage of such amplifier. This shunt resistor may have a greater resistance than the load resistor of the associated signal transmitting device so that the shunt resistor transmits a portion of the input signal applied to the input stage signal translating device, around such device to the output thereof in order to reduce the effective input signal to such device to balance the output signals of the amplifier. Another shunt resistor may be employed with the other signal translating device to balance the operating points of the two signal translating devices in the paraphase amplifier.

When transistors are employed as the signal translating devices in the paraphase amplifier of the present invention, it has been found that if the shunt resistors are made equal to the emitter bias resistors of such transistors the gain of such amplifier may be varied over an extremely large range by varying the resistance of the common emitter coupling impedance from zero to a very high value approaching an open-circuit without effecting an imbalance in the output signals produced. This gain variation may be accomplished by employing a plurality of fixed coupling resistors connected by means of a movable switch contact between the emitters of the transistors of such paraphase amplifiers so that the change in voltage gain of the amplifier may be determined directly by the values of such fixed resistors.

It is therefore one object of the present invention to provide an improved amplifier circuit having balanced push-pull output signals.

Another object of the invention is to provide an improved paraphase amplifier having balanced output signals over a wider range of gain variation.

A further object of the present invention is to provide an improved paraphase amplifier in which a shunt resistor is connected from the input to the output of the signal translating device employed in the input stage of such amplifier, such shunt resistor being provided with a resistance substantially equal to that of the emitter or cathode bias resistance of such device in order to provide balanced output signals over a wide range of gain variations.

An additional object of the present invention is to provide an improved paraphase amplifier having balanced output signals over a wide range of amplification effected by varying the common coupling resistance of the transistors or vacuum tubes employed in such amplifier between zero and open circuit.

Still another object of the invention is to provide an improved balanced paraphase amplifier whose gain may be varied by changing the common coupling impedance of the signal translating devices of such amplifier between a plurality of fixed resistors while maintaining the output signals balanced so that the steps of gain may be set by the values of such fixed resistors.

Figure 2:
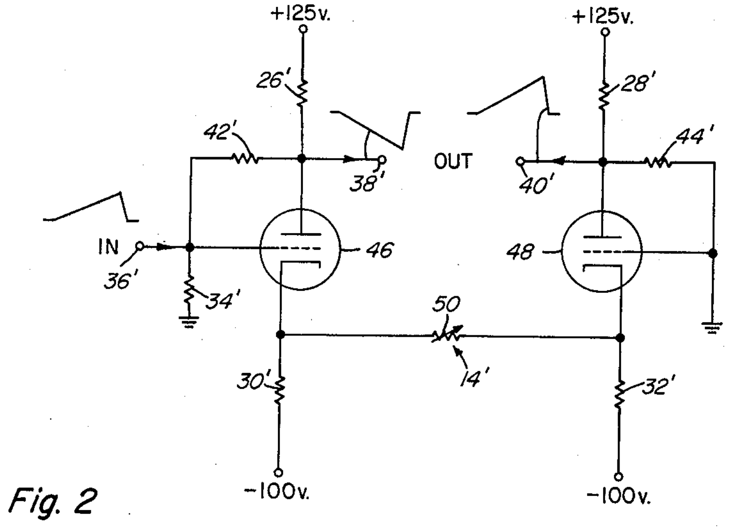

Other objects and advantages of the present invention will be apparent from the following detailed description of certain preferred embodiments thereof and from the attached drawings of which:

FIG. 1 is a schematic diagram of one embodiment of the paraphase amplifier of the present invention; and FIG. 2 is a schematic diagram of another embodiment of the present paraphase amplifier.

As shown in FIG. 1 the paraphase amplifier of the present invention may include a pair of signal translating devices 10 and 12 which may be PNP transistors of type 2N2207 whose emitters are coupled together through a common coupling impedance 14. The coupling impedance 14 may be in the form of a single variable resistor, as shown in FIG. 2, or a plurality of fixed resistors 16, 18, 20 and 22 of different values, such as 300, 600, 1500 and 3000 ohms respectively, which are connected between the emitters of transistors 10 and 12 by a movable switch contact 24. Each of the transistors 10 and 12 has its collector connected to a suitable source of positive D.C. supply voltage through a pair of load resistors 26 and 28, respectively, of 5000 ohms. The emitters of each of the transistors 10 and 12 are connected to a source of negative D.C. supply voltage through emitter bias resistors 30 and 32, respectively, of 30,000 ohms. The base of the transistor 10 may be connected to ground through a suitable base bias resistor 34 while the base of transistor 12 may be connected directly to ground or to some suitable reference voltage so that such transistors are biased normally conducting. The base of transistor 10 is connected to an input terminal 36 so that a single-ended input signal is applied to the base of transistor 10 and transmitted as push-pull output signals to the collectors of transistors 10 and 12 and output terminals 38 and 40, respectively, connected to such collectors. In this regard, the paraphase amplifier of FIG. 1 is similar to conventional paraphase amplifiers.

A pair of shunt resistors 42 and 44 of about 30,000 ohms are connected between the base and collector electrodes of transistors 10 and 12, respectively, in order to provide the paraphase amplifier with balanced output signals in the manner of the present invention. These shunt resistors are provided with a resistance substantially the same as the resistance of the emitter bias resistors 30 and 32. The value of shunt resistor 42 is determined by positioning the switch contact 24 in an open circuit condition and selecting the value of such shunt resistor which given zero output voltage at output terminal 38 for any signal voltage at the terminal 36. This balances the two output signals for all values of common coupling impedance 14 from zero to infinity or open circuit. Shunt resistor 42 functions primarily to transmit or "feed forward" a portion of the input signal applied to the input terminal 36 at the base of transistor 10 around the collector junction of such transistor directly to the collector thereof. This reduces the effective input signal seen by the emitter junction of transistor 10 and thus reduces the output voltage on the collector of such transistor by reducing such input signal. The output signal produced across load resistor 26 is further reduced because the shunt current transmitted from the base to the collector of transistor 10 through shunt resistor 42, is opposite in phase to the amplified input signal transmitted through such transistor. This balances the output signals produced on output terminals 38 and 40 over a wide range of gain variations for the paraphase amplifier caused by varying the common coupling impedance 14 in steps corresponding to different positions of switch contact 24 which changes the resistance of the coupling impedance between resistors 16 to 22.

Previous paraphase amplifiers, not employing shunt resistors 42 and 44, have been limited to comparably small gain variations of about 3 to 1 because any further increase in the emitter coupling resistance between transistors 10 and 12 caused a signal amplification imbalance due to the fact that the transistor 12 sees a smaller input signal on its emitter than the effective input signal of transistor 10. The shunt resistor 42 of the present invention compensates for this by transmitting a portion of the input signal of transistor 10 around the collector junction of such transistor to the output terminal 38 to reduce the output signal produced upon such output terminal. This balances the amplitudes of the output signals of the two transistors and maintains in balance over a wide range of gain variations. Thus, it is possible that the common emitter coupling impedance 14 may vary from zero to an effective open circuit value without causing output signal imbalance. It should be noted that the shunt resistors 42 and 44 do not provide negative voltage feedback since in most cases the load resistors 26 and 28 are small in resistance compared to the emitter bias resistors 30 and 32 and compared to the shunt resistors 42 and 44, but rather these shunt resistors function primarily as negative current "feed forward" resistors in the manner discussed above.

Since the use of shunt resistor 42 changes the D.C. operating point of the first transistor 10 the second shunt resistor 44 is added to the second transistor 12 to also change the operating point of the second transistor until it is approximately the same as that of the other transistor. Of course, the second shunt resistor 44 does not provide "feed forward" current in a similar manner to the shunt resistor 42 because the input signal of the second transistor 12 is applied to the emitter, not the base, of such transistor. It should be noted that the operative points of the transistors may be balanced without the use of shunt resistor 44 merely by changing the value of load resistor 28.

Since the output signals of the paraphase amplifier of FIG. 1 are balanced in all settings of the switch contact 24, the variation in gain effected by switching between the fixed emitter coupling resistors 16, 18, 20 and 22 may be determined directly by the resistance ratio of such resistors. Thus, since the emitter coupling resistors 16, 18, 20 and 22 are respectively 300 ohms, 600 ohms, 1.5 kilohms, and 3 kilohms, movement of the switch contact 24 from resistor 22 to resistor 20 changes the gain by the ratio 3000/1500 or 2 times. In a similar manner, movement of the switch contact 24 from resistor 22 to resistor 18 changes the gain 3000/600 or 5 times, and movement of such contact from resistor 22 to resistor 16 increases the gain to 3000/300 or 10 times its lowest amount. This enables the gain of the paraphase amplifier to be set in exact discrete steps by selecting fixed resistors of known value.

Another embodiment of the paraphase amplifier of the present invention is shown in FIG. 2 which is similar to the amplifier circuit of FIG. 1 except that transistors 10 and 12 have been replaced by vacuum tubes 46 and 48, respectively, which may be dual triodes of type 6DJ8. Also, the variable gain coupling impedance 14 including fixed resistors 16, 18, 20 and 22 and switch contact 24, has been replaced by a single variable resistance potentiometer 50 of 30,000 ohms connected between the cathodes of such tubes. The remaining components of this circuit are identical in function to those in the circuit of FIG. 1 and for this reason have been labeled with similar numbers. However, the shunt resistors 42' and 44' are made equal to the sum of the resistance of the cathode bias resistors 30' and 32' plus the reciprocal of the mutual conductance of their respective vacuum tubes 46 and 48. Thus, if the cathode bias resistors 30' and 32' are both 20 kilohms and the value of $1/G_m$ of the tubes is approximately 200 ohms then the resistance of the shunt resistors 42' and 44' is 20.2 kilohms.

While the resistance of the emitter junction of the transistors 10 and 12 of FIG. 1 is quite small, on the order of 10 ohms, and may be neglected in determining the value of the shunt resistors 42 and 44, this may not be necessarily true of mutual conductance in circuits employing vacuum tubes since the internal impedance of such tubes may be significant compared to the resistance of the cathode bias resistors. However, even in this case it can be said that the resistance of the shunt resistors is substantially equal to the cathode bias resistors.

The vacuum tube paraphase amplifier circuit of FIG. 2 functions in substantially the same way as the transistor paraphase circuit of FIG. 1 in that the shunt resistors 42' and 44' function in a similar manner to the corresponding shunt resistors in FIG. 1. Thus, shunt resistor 42' transmits a portion of the input signal applied to input terminal 36' around the vacuum tube 46 from the grid to the anode of such vacuum tube to reduce the effective input signal seen by such tube and to reduce the output signal produced at output terminal 38' across the load resistor 26'. This causes the two output signals produced on output terminals 38' and 40' to be balanced for a wide range of gain variations effected by varying the common cathode coupling resistor 50. The shunt resistor 44' is connected from the grounded grid of tube 48 to the anode of such tube in order to balance the operating points of the two vacuum tubes 46 and 48 by compensating for the change in operating point of tube 46 caused by the addition of shunt resistor 42'.

It will be obvious to those having ordinary skill in the art that various changes may be made in the details of the above described preferred embodiments of the present invention without departing from the spirit of the invention. For example, the D.C. supply voltage applied to the second bias resistors 32 and 32' may be different from that applied to the first bias resistors 30 and 30' so that such second bias resistors are of a different resistance than the first bias resistors, and the same thing is true of the load resistors. Therefore, the scope of the invention should only be determined by the following claims.

I claim:

1. An amplifier circuit comprising:

a pair of signal translating devices having an emitting electrode, a collecting electrode and a control electrode;

a pair of load impedances respectively connected to each of the collecting electrodes of said devices;

means to apply D.C. bias voltages to the emitting electrodes of said devices;

a variable coupling impedance connected between the emitting electrodes of said devices; and shunt means to transmit a portion of the input signal current applied to the control electrode of one of said devices around said one device to the collecting electrode of said one device to balance the output signals produced across said load impedances.

2. An amplifier circuit comprising:
a pair of signal amplifying devices of similar characteristics having an emitting electrode, a collecting electrode and a control electrode;
a pair of load impedances respectively connected to each of the collecting electrodes of said devices;
a pair of bias resistances respectively connected to each of the emitting electrodes of said devices;
a variable coupling resistance connected between the emitting electrodes of said devices and across said bias resistors to vary the gain of said amplifier circuit; and
a shunt resistance connected between the control electrode and the collecting electrode of one of said devices to transmit a portion of an input signal applied to its control electrodes around said one device to its collecting electrode, said shunt resistance having a resistance which is substantially equal to that portion of the bias resistance associated with said one device.

3. A paraphase amplifier circuit comprising:
a pair of signal amplifying devices of similar characteristics having an emitting electrode, a collecting electrode and a control electrode with the control electrode of one of said devices connected to the input terminal of said amplifier circuit and the control electrode of the other device connected to a signal ground terminal;
a pair of load impedances respectively connected to each of the collecting electrodes of said devices;
a pair of bias resistances respectively connected to each of the emitting electrodes of said devices;
a variable coupling resistance connected between the emitting electrodes of said devices and across said bias resistances to vary the gain of said amplifier circuit; and
a pair of shunt resistances connected with one of said shunt resistances between the control electrode and the collecting electrode of each of said devices, each of said shunt resistances having a similar resistance which is substantially equal to that of the bias resistance of said one device, to transmit a portion of the input signal current applied to the control electrode of one of said devices around said one device to the collecting electrode of said one device in order to balance the output signals produced across said load impedances over any gain variation effected by changing said coupling resistance.

4. A paraphase amplifier circuit comprising:
a pair of transistors of similar characteristics having an emitter electrode, a collector electrode and a base electrode with the base electrode of one of said transistors connected to the input terminal of said circuit;
a pair of load impedances respectively connected to each of the collector electrodes of said transistors;
a pair of bias resistances respectively connected to each of the emitter electrodes of said transistors;
a source of D.C. supply voltage connected across said load impedances and said bias resistances;
a variable coupling resistance connected between the emitter electrodes of said transistors and across said bias resistances to vary the gain of said amplifier circuit; and
a pair of shunt resistances connected with one of said shunt resistances between the base electrode and the collector electrode of each of said transistors, each of said shunt resistances having a similar resistance which is substantially equal to that of the bias resistance of said one transistor, to transmit a portion of the input signal current applied to the base electrode of said one transistor around the collector junction to the collector electrode of said one transistor to reduce the effective input signal of said one transistor in order to balance the output signals produced across said load impedances over a wide range of gain variations effected by changing said coupling resistance.

5. A paraphase amplifier circuit comprising:
a pair of electron tubes of similar characteristics having an anode, a cathode and a grid with the grid of one of said tubes connected to the input terminal of said circuit;
a pair of load impedances respectively connected to each of the anodes of said tubes;
a pair of bias resistances respectively connected to each of the cathodes of said tubes;
means for applying a D.C. supply voltage across said load impedances and said bias resistances;
a variable coupling resistance connected between the cathodes of said tubes and across said bias resistances to vary the gain of said amplifier circuit; and
feed forward means including a pair of shunt resistances connected with a different one of said shunt resistances between the grid and the anode of each of said tubes, each of said shunt resistances having a similar resistance which is substantially equal to the sum of the reciprocal of the mutual conductance of said one tube plus the resistance of the bias resistance of said one tube, to transmit a portion of the input signal current applied to the grid of said one tube around said one tube to the anode of said one tube and to balance the output signals produced across said load impedances over a wide range of gain variations effected by changing said coupling resistance.

References Cited by the Examiner

UNITED STATES PATENTS

| | | | |
|---|---|---|---|
| 2,903,525 | 9/1959 | Cooke | 330—117 X |
| 2,920,194 | 1/1960 | Geiger et al. | 330—173 X |
| 3,023,368 | 2/1962 | Erath | 330—20 X |
| 3,024,424 | 3/1962 | Dudziak | 330—173 |
| 3,161,045 | 12/1964 | Ames. | |

ROY LAKE, *Primary Examiner.*